(12) United States Patent
Hoeks

(10) Patent No.: US 7,145,636 B2  
(45) Date of Patent: Dec. 5, 2006

(54) SYSTEM AND METHOD FOR DETERMINING MAXIMUM OPERATIONAL PARAMETERS USED IN MASKLESS APPLICATIONS

(76) Inventor: Martinus Hendricus Hoeks, Evertsenlaan 15, NL-5694 Breugel (NL)

( * ) Notice: Subject to any disclaimer, the term of this patent is extended or adjusted under 35 U.S.C. 154(b) by 48 days.

(21) Appl. No.: 11/022,925

(22) Filed: Dec. 28, 2004

(65) Prior Publication Data

US 2006/0139588 A1    Jun. 29, 2006

(51) Int. Cl.  
*G03B 27/42* (2006.01)  
*G03B 27/54* (2006.01)

(52) U.S. Cl. .......................................... 355/53; 355/67
(58) Field of Classification Search ................ 355/52, 355/53, 55, 67; 430/5, 20, 30; 250/548; 356/399–401
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,978,071 A * | 11/1999 | Miyajima et al. | 355/53 |
| 5,982,553 A | 11/1999 | Bloom et al. | |
| 6,133,986 A | 10/2000 | Johnson | |
| 6,177,980 B1 | 1/2001 | Johnson | |
| 6,285,488 B1* | 9/2001 | Sandstrom | 359/290 |
| 6,687,041 B1 | 2/2004 | Sandstrom | |
| 6,747,783 B1 | 6/2004 | Sandstrom | |
| 6,795,169 B1 | 9/2004 | Tanaka et al. | |
| 6,806,897 B1 | 10/2004 | Kataoka et al. | |
| 6,811,953 B1 | 11/2004 | Hatada et al. | |
| 6,833,908 B1* | 12/2004 | Markle | 355/77 |
| 6,897,941 B1* | 5/2005 | Almogy | 355/67 |
| 2004/0041104 A1 | 3/2004 | Liebregts et al. | |
| 2004/0130561 A1 | 7/2004 | Jain | |
| 2005/0007572 A1 | 1/2005 | George et al. | |
| 2005/0024613 A1* | 2/2005 | Bleeker | 355/67 |

FOREIGN PATENT DOCUMENTS

| WO | WO 98/33096 | 7/1998 |
|---|---|---|
| WO | WO 98/38597 | 9/1998 |

* cited by examiner

*Primary Examiner*—Henry Hung Nguyen  
(74) *Attorney, Agent, or Firm*—Sterne, Kessler, Goldstein & Fox P.L.L.C.

(57) ABSTRACT

A lithographic method and apparatus used to pattern an object. An illumination source supplies a beam of radiation. A pattern generator forms a pattern to pattern a beam of radiation using the pattern data. A projection system projects the patterned beam onto a target portion of a substrate supported by a stage during an exposure operation. A control module determines a respective maximum operational parameter for the illumination source, the pattern generator, and/or the stage.

15 Claims, 4 Drawing Sheets

SYSTEM AND METHOD FOR DETERMINING MAXIMUM OPERATIONAL PARAMETERS USED IN MASKLESS APPLICATIONS

BACKGROUND OF THE INVENTION

1. Field of the Invention

The present invention is directed to a light patterning device and a method of using the same.

2. Background Art

A patterning device is used to pattern incoming light. A dynamic patterning device can include an array of individually controllable elements that generate a pattern through receipt of analog or digital signals. The algorithm used to control the dynamic patterning device, so that its individually controllable elements are in a proper state to form a desired pattern, is called a rasterization algorithm or optical rasterization algorithm. Example environments for use of the patterning device can be, but are not limited to, a lithographic apparatus, a projector, a projection display apparatus, or the like.

Generally speaking, rasterization algorithms begin with a rendering engine receiving image data (e.g., mask file) via a data path. The image data includes a representation of the image to be patterned by the patterning device. The image data is converted into pattern data, which includes the proper state of the individually controllable elements of the dynamic patterning device. The pattern data is sent through the data path to control the individually controllable elements of the dynamic patterning device.

If the feature density of the image file exceeds the maximum rendering capacity of the data path, the rasterization algorithm may be aborted. There are at least two possible solutions to prevent the rasterization algorithm from being aborted. First, the rendering capacity of the rendering engine can be increased by expanding and or upgrading the rendering engine (which could take a long lead-time in which the design can not be printed); however, it remains possible that for a particular image file the feature density could even exceed the increased rendering capacity. Second, the scan speed of the patterning device can be adjusted in real-time in accordance with the feature density of the image file, so as not to exceed the maximum rendering capacity; however, this is difficult and could give rise to irregularities in the patterned beam.

Therefore, what is needed is a system and method for rendering an image file that prevents exceeding the rendering capacity of the data path. To avoid irregularities, the system and method should not include real-time adjustments during the rendering process.

BRIEF SUMMARY OF THE INVENTION

According to an aspect of the present invention, there is provided a lithography system including, an illumination source, a pattern generator, a projection system, and a control module. The illumination source supplies a beam of radiation. The pattern generator patterns the beam of radiation. The projection system projects the patterned beam onto a target portion of a substrate supported by a stage during an exposure operation. The control module couples to at least one of the illumination source, the pattern generator, and the stage. The control module determines a respective maximum operational parameter for at least one of the illumination source, the pattern generator, and the stage.

According to another aspect of the present invention, there is provided a method for using a lithography system, including the following steps. A maximum value for at least one operational parameter of the maskless lithography system is determined before an exposure operation. The maximum values of the at least one operational parameter are used to set the respective at least one operational parameter of the maskless lithography system. A beam of radiation is patterned using a pattern generator of the maskless lithography system. The patterned beam of radiation is projected onto a target portion of a substrate supported by a stage during the exposure operation.

Further embodiments, features, and advantages of the present invention, as well as the structure and operation of the various embodiments of the present invention, are described in detail below with reference to the accompanying drawings.

It is to be appreciated that the foregoing Summary represents one or more exemplary embodiments and/or examples, but not all embodiments and/or examples of the present invention, and thus should not be seen to be limiting the present invention, or the appended claims, in any way.

BRIEF DESCRIPTION OF THE DRAWINGS/FIGURES

The accompanying drawings, that are incorporated herein and form a part of the specification, illustrate the present invention and, together with the description, further serve to explain the principles of the invention and to enable a person skilled in the pertinent art to make and use the invention.

The present invention will now be described with reference to the accompanying drawings. In the drawings, like reference numbers may indicate identical or functionally similar elements.

DETAILED DESCRIPTION OF THE INVENTION

I. Overview

Figure 1:
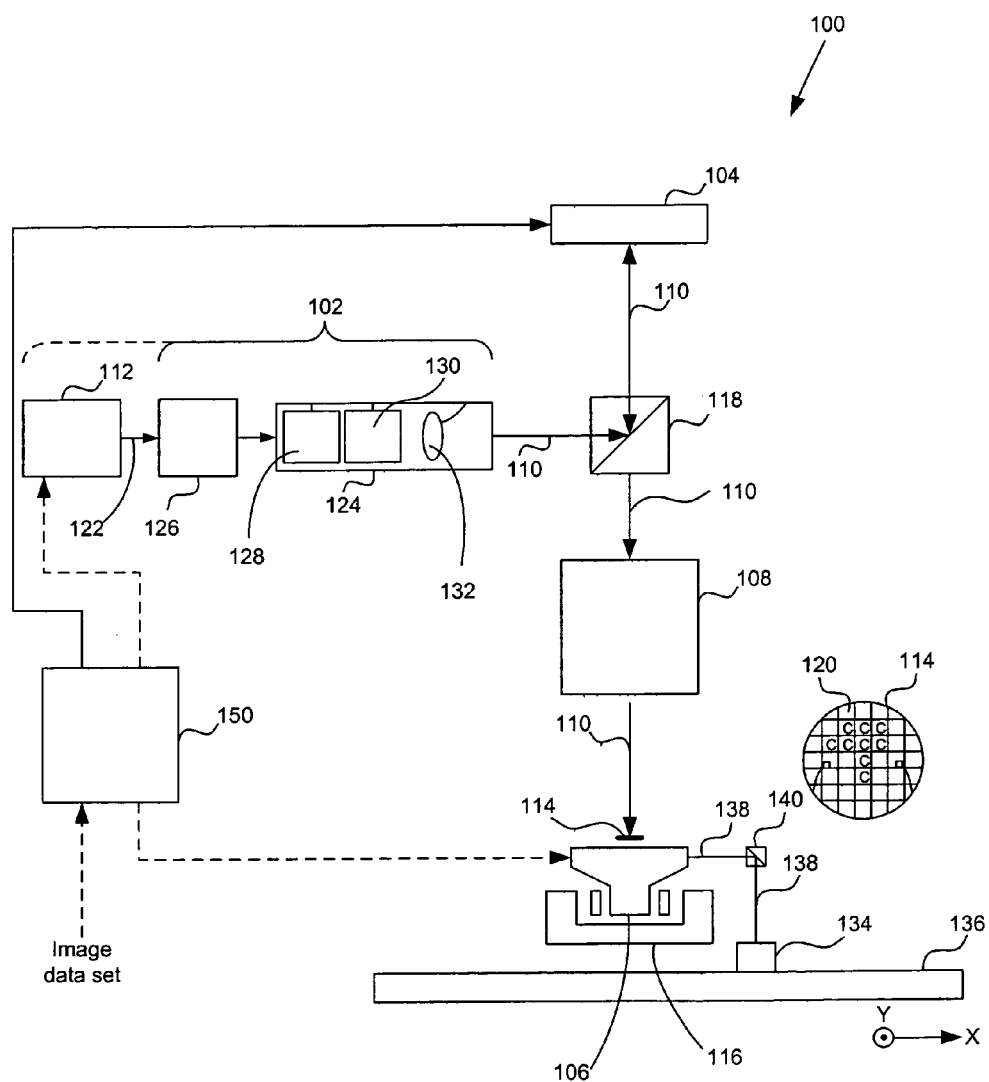
FIG. 1 depicts an exemplary lithographic apparatus, in accordance with an embodiment of the present invention.

Although specific reference can be made in this text to the use of lithographic apparatus in the manufacture of integrated circuits (ICs), it should be understood that the lithographic apparatus described herein can have other applications, such as the manufacture of integrated optical systems, guidance and detection patterns for magnetic domain memories, flat panel displays, thin-film magnetic heads, micro and macro fluidic devices, etc.

A system and method of the present invention are used to pattern light using an illumination source, a pattern generator, a projection system, and a control module. The illumination source supplies a beam of radiation. The pattern generator forms a pattern to pattern the beam of radiation. The projection system projects the patterned beam onto a target portion of a substrate supported by a stage. The control module determines the at least one maximum operational parameter for the system. In various examples, the substrate can be a display device, a semiconductor substrate or wafer, a flat panel display glass substrate, or the like.

In an example, image data is compressed to reduce the amount of memory in a data path. Since the compression is performed before an exposure operation, the control module can calculate the following before an exposure operation is performed: a maximum frequency for the illumination source; a maximum data rate, decompression and/or rendering rate for a pattern generator; and/or a maximum stage speed for the stage that supports the substrate.

The Detailed Description is divided into five subsections. In subsection II, terminology used in this document is disclosed. In subsection III, an exemplary lithographic apparatus is described. In subsection IV, an exemplary method for mask writing is described. Subsection V includes a discussion of an example advantage. Lastly, in subsection VI, concluding remarks are discussed.

II. Terminology

The use of the terms "wafer" or "die" herein can be considered as synonymous with the more general terms "substrate" or "target portion", respectively. The substrate referred to herein can be processed, before or after exposure, in, for example, a track (a tool that typically applies a layer of resist to a substrate and develops the exposed resist) or a metrology or inspection tool. Where applicable, the disclosure herein can be applied to such and other substrate processing tools. Further, the substrate can be processed more than once, for example in order to create a multilayer IC, so that the term substrate used herein can also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultraviolet (EUV) radiation (e.g., having a wavelength in the range of 5–20 nm), as well as particle beams, such as ion beams or electron beams.

The term "array of individually controllable elements" as here employed should be broadly interpreted as referring to any device that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning devices are discussed below.

The term "projection system" used herein should be broadly interpreted as encompassing various types of projection systems, including refractive optical systems, reflective optical systems, and catadioptric optical systems, as appropriate, for example, for the exposure radiation being used, or for other factors such as the use of an immersion fluid or the use of a vacuum. Any use of the term "lens" herein can be considered as synonymous with the more general term "projection system."

III. An Exemplary Lithographic Apparatus

FIG. 1 schematically depicts a lithographic projection apparatus 100 according to an embodiment of the present invention. Apparatus 100 includes at least a radiation system 102, a pattern generator 104, a projection system 108 ("lens"), and an object table 106 (e.g., a substrate table). An overview of the operation of lithographic apparatus 100 follows. Then alternative embodiments of lithographic apparatus 100 are discussed. After the overview and alternative embodiments of lithographic apparatus 100, details and alternative embodiments of each of the elements in apparatus 100 are described.

A. Overview and Alternative Embodiments

Radiation system 102 can be used for supplying a beam 110 of radiation (e.g., UV radiation). In this particular case, radiation system 102 also comprises a radiation source 112. Beam 110 subsequently intercepts the pattern generator 104 after being directed using beam splitter 118. Pattern generator 104 (e.g., a programmable mirror array) can be used for applying a pattern to beam 110. Having been reflected by pattern generator 104, beam 110 passes through projection system 108, which focuses beam 110 onto a target portion 120 of the substrate 114.

In an alternative embodiment (not shown), lithographic apparatus 100 can be of a type having two (e.g., dual stage) or more substrate tables (and/or two or more mask tables). In such "multiple stage" machines the additional tables can be used in parallel, or preparatory steps can be carried out on one or more tables while one or more other tables are being used for exposure.

Lithographic apparatus 100 can also be of a type wherein the substrate is immersed in a liquid (not shown) having a relatively high refractive index (e.g., water), so as to fill a space between the final element of the projection system and the substrate. Immersion liquids can also be applied to other spaces in the lithographic apparatus, for example, between the substrate and the first element of the projection system. Immersion techniques are well known in the art for increasing the numerical aperture of projection systems.

Further, lithographic apparatus 100 can be provided with a fluid processing cell to allow interactions between a fluid and irradiated parts of the substrate (e.g., to selectively attach chemicals to the substrate or to selectively modify the surface structure of the substrate).

Although lithography apparatus 100 according to an embodiment of the present invention is herein described as being for exposing a resist on a substrate, it will be appreciated that the invention is not limited to this use and apparatus 100 can be used to project a patterned beam 110 for use in resistless lithography.

B. Radiation System

Radiation system 102 can include a source 112, a conditioning device 126, and an illumination source (illuminator) 124. In addition, illuminator 124 will generally include various other components, such as an integrator 130 and a condenser 132.

Source 112 (e.g., an excimer laser) can produce a beam of radiation 122. Beam 122 is fed into illumination source (illuminator) 124, either directly or after having traversed conditioning device 126, such as a beam expander, for example. Adjusting device 128 can be used for setting the outer and/or inner radial extent (commonly referred to as σ-outer and σ-inner, respectively) of the intensity distribution in beam 122. In this way, beam 110 impinging on the pattern generator 104 has a desired uniformity and intensity distribution in its cross section.

It should be noted, with regard to FIG. 1, that source 112 can be within the housing of lithographic projection apparatus 100 (as is often the case when source 112 is a mercury lamp, for example). In alternative embodiments, source 112 can also be remote from lithographic projection apparatus 100. In this case, radiation beam 122 would be directed into apparatus 100 (e.g., with the aid of suitable directing mirrors). This latter scenario is often the case when source 112 is an excimer laser. It is to be appreciated that both of these scenarios are contemplated within the scope of the present invention.

The illumination source can also encompass various types of optical components, including refractive, reflective, and catadioptric optical components for directing, shaping, or controlling the beam of radiation, and such components can also be referred to below, collectively or singularly, as a "lens."

C. Pattern Generator

Pattern generator 104 includes SLMs that can be regarded as replacing a conventional reticle. In addition to the SLM, pattern generator 104 may comprise driving electronics for the SLM pixels and a data path. Input image data is transformed into a suitable format and fed to the SLM by control module 150 (described in more detail below), via the data path. The drive electronics addresses each SLM pixel in sequence as the SLM pattern is updated, i.e., each new SLM image frame can be loaded by normal matrix addressing. The frame rate, i.e., the time required to load each new frame onto the SLM, is a determining factor on apparatus throughput.

Current technology may not allow construction of a single SLM that can provide the massive array of pixels necessary to give the throughput required in many applications. Thus, typically a multiple SLM array (MSA) is used in parallel to provide the number of pixels needed. For example, the pixels from different SLMs of the MSA are "stitched" together to form a cohesive image on the substrate. This can be done using motion control and gray scaling techniques. In the following description, for most instances, a reference to an SLM can also be interpreted as including an MSA.

In general, the position of pattern generator 104 can be fixed relative to projection system 108. However, in an alternative arrangement, pattern generator 104 can be connected to a positioning device (not shown) for accurately positioning it with respect to projection system 108. As depicted in FIG. 1, pattern generator 104 is of a reflective type, e.g., a programmable mirror array.

It will be appreciated that, as an alternative, a filter can filter out the diffracted light, leaving the undiffracted light to reach the substrate. An array of diffractive optical micro electrical mechanical system (MEMS) devices can also be used in a corresponding manner. Each diffractive optical MEMS device can include a plurality of reflective ribbons that can be deformed relative to one another to form a grating that reflects incident light as diffracted light.

A further alternative embodiment can include a programmable mirror array employing a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means.

In the situations described here above, the array of individually controllable elements can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference in their entireties.

A programmable LCD array can also be used. An example of such a construction is given in U.S. Pat. No. 5,229,872, which is incorporated herein by reference in its entirety.

Examples of other types of pattern generators can include, but are not limited to, tilting reflective devices, pistoning reflective devices, graytoning transmissive devices and graytoning reflective devices.

D. Control Module

Control module 150 comprises the data path, and will typically include a storing device for storing a "mask file" and a rasterizer. The storing device contains the entire image to be printed on the substrate. The rasterizer converts appropriate portions of the image for loading on to the SLM into a bit map of SLM pixel values representing the pattern required to transfer the desired image to the substrate. Control module 150 will typically also comprise one or more frame buffers and other conventional components necessary for matrix addressing of the SLM each time a new SLM frame is loaded. Appropriate image digitization and SLM drive electronics will become apparent to one of ordinary skill in the art. For instance, control module 150 can be very similar to a bit map based mask-writer, but with appropriate matrix addressing drive circuitry for addressing individual SLM pixels of the particular type of SLM used.

As mentioned above, control module 150 supplies data to pattern generator 104 that controls the actuation state (e.g., voltage or tilt angle) of the individual SLMs of pattern generator 104. The ability to deliver data at a sufficiently high rate is therefore an important consideration in attaining desired substrate scan speeds (described below), and thus production rates. For instance, in the case of flat panel display (FPD) production the apparatus typically operates in pulse scan mode with lasers pulsing at 50 KHz with 10/20 nsec pulse duration. The high frequency is used to provide acceptable throughput because of the large substrate areas that must be scanned to produce FPDs. To load an SLM frame between pulses at this frequency can require data transfer rates of the order of about 10 to 100 Gpixels/sec or more. Very complicated and expensive data handling and driver systems are required to handle such high data transfer rates. In addition, with such high data transfer rates the chance of data errors occurring is proportionately non-negligible.

Unless otherwise specified, through the rest of this description, the term "data transfer requirement" is to be understood to mean the amount of data that must be transferred to the SLM for updating the image frame.

Figure 2:
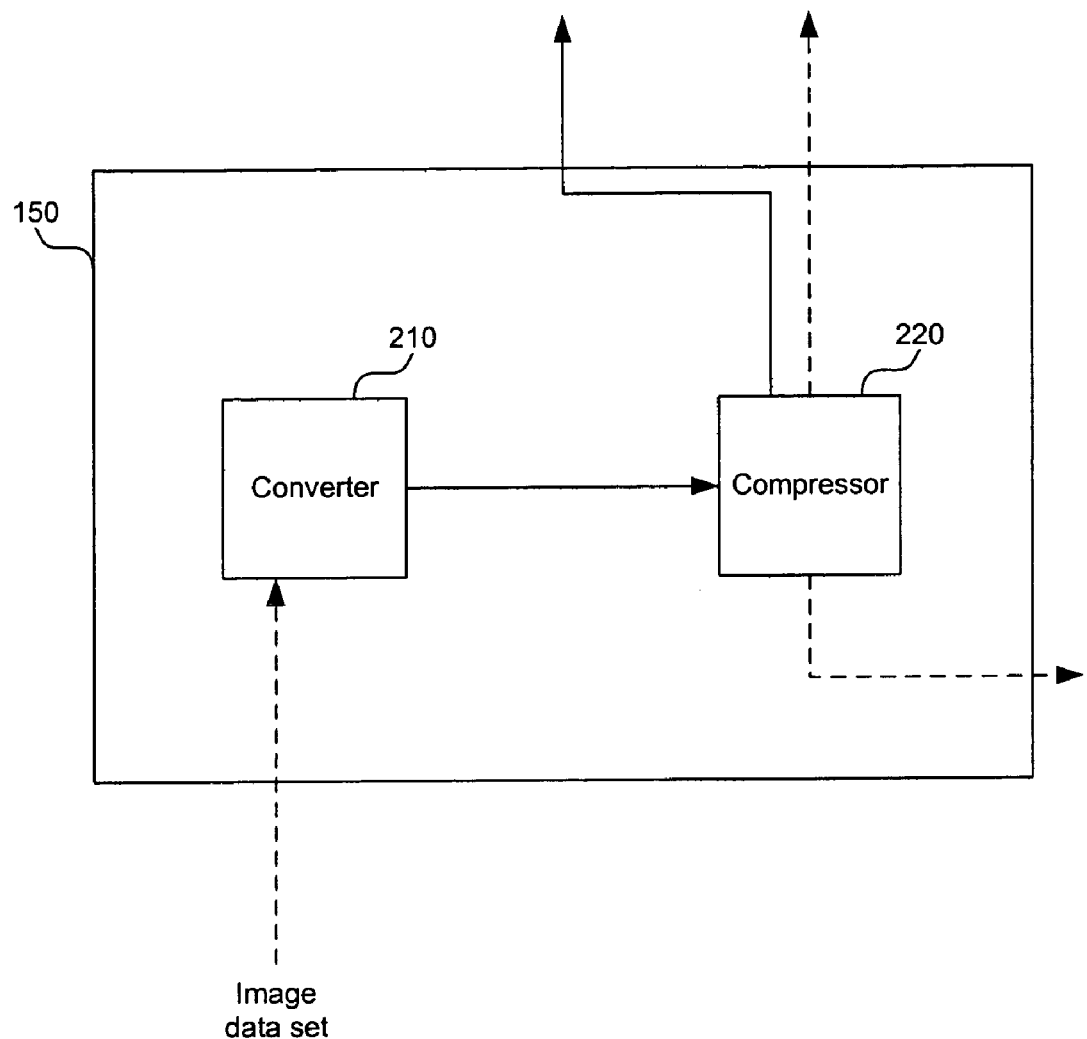
FIG. 2 depicts an exemplary control module, in accordance with an embodiment of the present invention.

FIG. 2 depicts an exemplary embodiment of control module 150, in accordance with an embodiment of the present invention. In this embodiment, control module 150 includes a converter 210 and a compressor 220. Converter 210 receives an image data set (e.g., a GDSII file) and converts it into a pattern data set. The conversion of the image data set to the pattern data set can be performed, for example, by rasterization algorithms known by a person having ordinary skill in the relevant art, or by some other rasterization algorithms. As indicated in FIG. 2, compressor 220 receives the pattern data set from converter 210. Compressor 220 compresses the pattern data set and calculates maximum operational parameters (e.g. scan speed of pattern generator 104, frequency of illumination source 102, or stage speed of stage 106) based on the compression. At least one of the operational parameters of lithography apparatus 100 is set according to the calculation of compressor 220.

Figure 3:
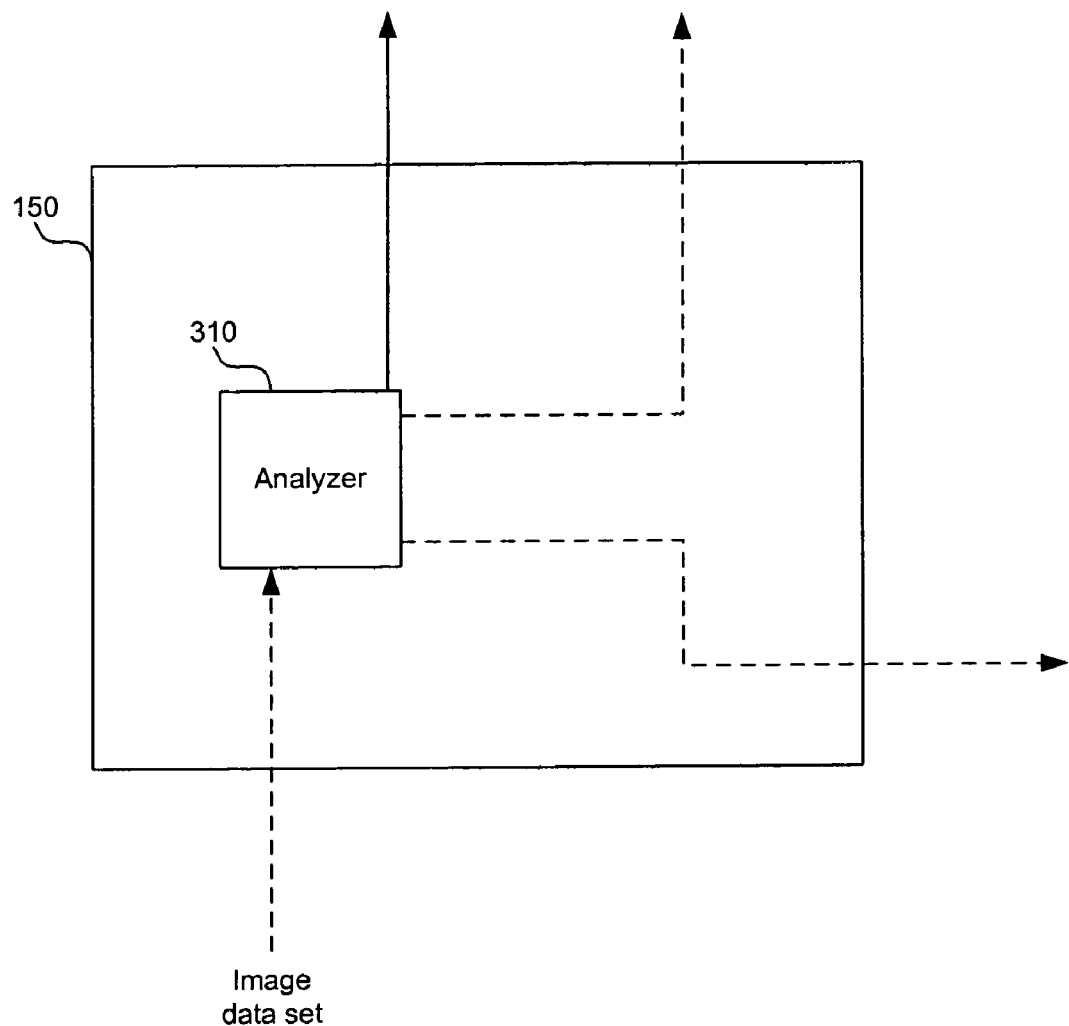
FIG. 3 depicts an exemplary control module, in accordance with an alternative embodiment of the present invention.

FIG. 3 depicts another exemplary embodiment of control module 150, in accordance with an alternative embodiment of the present invention. In this alternative embodiment, control module 150 includes an analyzer 310. Analyzer 310 receives and analyzes an input image data set to determine the maximum operational parameters of lithographic apparatus 100 before an exposure operation occurs (i.e., before beam 110 is patterned by pattern generator 104 and projected at target 114). For example, analyzer 310 can analyze the feature density of the input image data set and set the maximum operational parameters of lithographic apparatus 100 based on the feature density. In a similar manner to the example of FIG. 2, at least one of the operational parameters of lithography apparatus 100 is set according to the analysis of analyzer 310.

E. Projection System

Projection system 108 (e.g., a quartz and/or CaF2 lens system or a catadioptric system comprising lens elements made from such materials, or a mirror system) can be used for projecting the patterned beam received from a beam splitter 118 onto a target portion 120 (e.g., one or more dies) of substrate 114. Projection system 108 can project an image of the pattern generator 104 onto substrate 114. Alternatively, projection system 108 can project images of secondary sources so that the elements of the pattern generator 104 act as shutters. Projection system 108 can also comprise a micro lens array (MLA) to form the secondary sources and to project microspots onto substrate 114.

F. Object Table

Object table 106 can be provided with a substrate holder (not specifically shown) for holding a substrate 114 (e.g., a resist coated silicon wafer, a projection system display or a projection television display device). In addition, object table 106 can be connected to a positioning device 116 for accurately positioning substrate 114 with respect to projection system 108.

With the aid of positioning device 116 (and optionally interferometric measuring device 134 on a base plate 136 that receives interferometric beams 138 via beam splitter 140), object table 106 can be moved accurately, so as to position different target portions 120 in the path of beam 110. Where used, the positioning device for the pattern generator 104 can be used to accurately correct the position of the pattern generator 104 with respect to the path of beam 110, e.g., during a scan. In general, movement of object table 106 is realized with the aid of a long-stroke module (course positioning) and a short-stroke module (fine positioning), that are not explicitly depicted in FIG. 1. A similar system can also be used to position pattern generator 104. It will be appreciated that beam 110 can alternatively/additionally be moveable, while object table 106 and/or the pattern generator 104 can have a fixed position to provide the required relative movement.

In an alternative configuration, object table 106 can be fixed, with substrate 114 being moveable over object table 106. Where this is done, object table 106 is provided with a multitude of openings on a flat uppermost surface, gas being fed through the openings to provide a gas cushion that is capable of supporting substrate 114. This is conventionally referred to as an air bearing arrangement. Substrate 114 is moved over object table 106 using one or more actuators (not shown), that are capable of accurately positioning substrate 114 with respect to the path of beam 110. Alternatively, substrate 114 can be moved over object table 106 by selectively starting and stopping the passage of gas through the openings.

It should be appreciated that where pre-biasing of features, optical proximity correction features, phase variation techniques and multiple exposure techniques are used, for example, the pattern "displayed" on pattern generator 104 can differ substantially from the pattern eventually transferred to a layer of or on the substrate. Similarly, the pattern eventually generated on the substrate can not correspond to the pattern formed at any one instant on pattern generator 104. This can be the case in an arrangement in which the eventual pattern formed on each part of the substrate is built up over a given period of time or a given number of exposures during which the pattern on pattern generator 104 and/or the relative position of the substrate changes.

G. Exemplary Modes of Operation

The depicted apparatus 100 can be used in four preferred modes:

1. Step mode: the entire pattern on pattern generator 104 is projected in one go (i.e., a single "flash") onto a target portion 120. Object table 106 is then moved in the x and/or y directions to a different position for a different target portion 120 to be irradiated by patterned beam 110.

2. Scan mode: essentially the same as step mode, except that a given target portion 120 is not exposed in a single "flash." Instead, pattern generator 104 is movable in a given direction (the so-called "scan direction", e.g., the y direction) with a speed v, so that patterned beam 110 is caused to scan over the array of individually controllable elements 104. Concurrently, object table 106 is simultaneously moved in the same or opposite direction at a speed V=Mv, in that M is the magnification of projection system 108. In this manner, a relatively large target portion 120 can be exposed, without having to compromise on resolution.

3. Pulse mode: pattern generator 104 is kept essentially stationary and the entire pattern is projected onto a target portion 120 of substrate 114 using pulsed radiation system 102. Object table 106 is moved with an essentially constant speed such that patterned beam 110 is caused to scan a line across substrate 114. The pattern on pattern generator 104 is updated as required between pulses of radiation system 102 and the pulses are timed such that successive target portions 120 are exposed at the required locations on substrate 114. Consequently, patterned beam 110 can scan across substrate 114 to expose the complete pattern for a strip of substrate 114. The process is repeated until substrate 114 has been exposed line by line.

4. Continuous scan mode: essentially the same as pulse mode except that a substantially constant radiation system 102 is used and the pattern on pattern generator 104 is updated as patterned beams 110 scans across substrate 114 and exposes it.

Regardless of the operation mode used, the pattern generated by the SLM or MSA of pattern generator 104 (i.e., the "on" or "off" state of each of the individually controllable elements—hereinafter referred to as "SLM pixels") are periodically updated to transfer the desired image to the substrate. For example, in step mode and scan mode, the pattern can be updated between each step or scan operation. In pulse mode, the SLM pattern is updated as required between pulses of the radiation system. In continuous scan mode, the SLM pattern is updated as the beam scans across the substrate.

Combinations and/or variations on the above described modes of use or entirely different modes of use can also be employed.

IV. Exemplary Method

Figure 4:
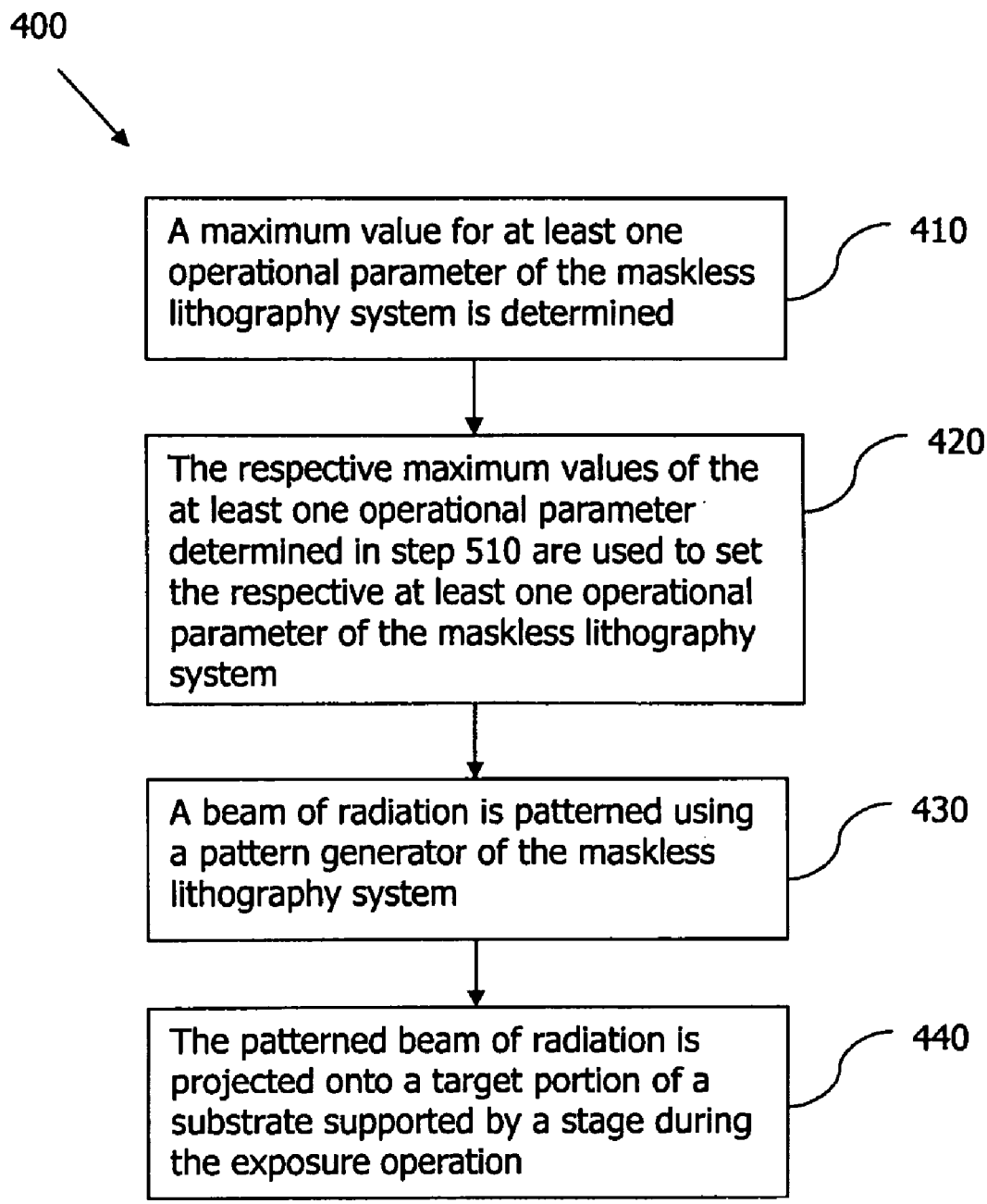
FIG. 4 illustrates a flowchart of a method for using a lithography system, in accordance with an embodiment of the present invention.

FIG. 4 illustrates a flowchart 400 that depicts an exemplary method for using a lithography systems, in accordance with an embodiment of the present invention. Flowchart 400 begins at step 410 in which a maximum value for at least one operational parameter of the maskless lithography system is determined. For example, the maximum value can be determined by control module 150.

In one example, the maximum value for the at least one operational parameter can be determined in the following manner. An image data set (e.g., union of polygons) is received and converted into a pattern data set (e.g., graytones). The pattern data set is compressed. Various compression techniques are known to persons skilled in the relevant art. Examples can include, but are not limited to, a Lempel and Ziv (LZ) adaptive dictionary-based algorithm, variations thereof, or some other compression algorithm.

During the compression, the one or more maximum operational parameters can be calculated. For example, the calculation of the one or more maximum operational parameters can be based on the time that is required to decompress the compressed pattern data set. The compression and calculation can be performed, for example, by compressor 220. In an example, the one or more maximum operational parameters can be associated with the pattern data as meta-information.

In another example, the maximum value for the at least one operational parameter can be determined before an exposure operation. In this example, an image data set can be analyzed; and the at least one maximum operational parameter can be determined from this analysis. The analysis can be performed, for example, by analyzer 310.

In a still further example, the at least one maximum operational parameter is used to perform a test scan (dummy exposure) operation before the actual exposure operation. Then the at least one maximum operational parameter can be adjusted based on the text exposure operation.

Referring back to FIG. 4, in step 420, the respective maximum values of the at least one operational parameter determined in step 410 are used to set the at least one operational parameter of the maskless lithography system. In the examples of FIGS. 2 and 3, compressor 220 and analyzer 310, respectively, can be used to set the respective maximum operational parameters; e.g., compressor 220 or analyzer 310 can be used to set the frequency of illumination source 102, the scan speed of pattern generator 104, and/or the stage speed of stage 106.

In step 430, a beam of radiation is patterned using a pattern generator of the maskless lithography system. For example, the beam of radiation can be patterned by pattern generator 104.

In step 440, the patterned beam of radiation is projected onto a target portion of a substrate supported by a stage during the exposure operation. For example, projection system 108 can project beam 110 onto substrate 114.

V. Example Advantage

Embodiments of the present invention prevent processing overruns (errors) for masks with sections where the spatial density exceeds the data path capacity without the need for real-time scan speed variations.

VI. Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

What is claimed is:

1. A lithography system, comprising:
an illumination source that supplies a beam of radiation;
a pattern generator that patterns the beam of radiation;
a projection system that projects the patterned beam onto a target portion of a substrate supported by a stage during an exposure operation; and
a control module coupled to at least one of the illumination source, the pattern generator, and the stage, wherein the control module reduces an amount of data in a datapath and determines a maximum operational parameter for at least one of the illumination source, the pattern generator, and the stage based on the reduced amount of data.

2. The system of claim 1, wherein the one or more maximum operational parameters comprise a frequency of the illumination source, a scan speed of the pattern generator, and a stage speed of the stage.

3. The system of claim 1, wherein the maximum operational parameter of the pattern generator comprise at least one of a data rate, a decompression capacity, and a rendering capacity.

4. The system of claim 1, wherein the control module comprises:
a converter that converts an image data set to a pattern data set; and
a compressor that compresses the pattern data set and calculates the one or more respective maximum operational parameters, which are associated as meta-information with the pattern data.

5. The system of claim 4, wherein the one or more maximum operational parameters are calculated before the exposure operation.

6. The system of claim 1, wherein the control module comprises:
an analyzer that analyzes the image data set and calculates the one or more maximum operational parameters.

7. The system of claim 6, wherein the one or more maximum operational parameters are used to perform a test exposure.

8. The system of claim 7, wherein the one or more maximum operational parameters are adjusted based on the test exposure.

9. The system of claim 1, wherein the substrate is one of a flat panel display substrate and semiconductor wafer.

10. A method for using a maskless lithography system, comprising:
(a) reducing an amount of data in a datapath and determining a maximum value for at least one operational parameter of the maskless lithography system before an exposure operation based on the reduced amount of data;
(b) using the maximum value of the at least one operational parameter determined in step (a) to set the at least one operational parameter of the maskless lithography system;
(c) patterning a beam of radiation using a pattern generator of the maskless lithography system; and
(d) projecting the patterned beam of radiation onto a target portion of a substrate supported by a stage during the exposure operation.

11. The method of claim 10, further comprising:
using at least one of a frequency of a beam of radiation, a scan speed of the pattern generator, and a stage speed of the stage as the at least one operational parameter.

12. The method of claim 10, further comprising:
using at least one of a data rate, a decompression capacity, and a rendering capacity as the operational parameter of the pattern generator.

13. The method of claim 10, wherein step (a) comprises:
compressing a pattern data set; and
calculating the one or more maximum values based on the compression of the pattern data set.

14. The method of claim 10, wherein step (a) comprises:
analyzing an image data set; and
calculating the one or more maximum values based on the analysis of the image data.

15. The method of claim 10, wherein step (a) further comprises:
using the one or more maximum values to perform a test exposure; and
adjusting the one or more maximum values based on the test exposure.

* * * * *

UNITED STATES PATENT AND TRADEMARK OFFICE
CERTIFICATE OF CORRECTION

PATENT NO. : 7,145,636 B2  Page 1 of 1
APPLICATION NO. : 11/022925
DATED : December 5, 2006
INVENTOR(S) : Martinus Hendricus Hoeks It is certified that error appears in the above-identified patent and that said Letters Patent is hereby corrected as shown below:

On the Title Page, insert item [73] ASML Netherlands B.V., Veldhoven (NL)

Signed and Sealed this

Twenty-fifth Day of November, 2008

JON W. DUDAS
*Director of the United States Patent and Trademark Office*